US010345355B2

(12) United States Patent
Lussier et al.

(10) Patent No.: US 10,345,355 B2
(45) Date of Patent: Jul. 9, 2019

(54) METHOD OF COMMUNICATION BETWEEN DISTRIBUTED WIRE HARNESS TEST UNITS USING WIRE UNDER TEST

(71) Applicant: ZIOTA TECHNOLOGY INC., Saint-Hubert (CA)

(72) Inventors: Alain Lussier, Ogden (CA); Patrick Parenteau, Montreal (CA); Marc-Antoine Allain, Granby (CA)

(73) Assignee: Ziota Technology Inc., St-Hubert (CA)

( * ) Notice: Subject to any disclaimer, the term of this patent is extended or adjusted under 35 U.S.C. 154(b) by 0 days.

(21) Appl. No.: 15/923,996

(22) Filed: Mar. 16, 2018

(65) Prior Publication Data

US 2018/0203053 A1    Jul. 19, 2018

Related U.S. Application Data

(63) Continuation-in-part of application No. 14/230,988, filed on Mar. 31, 2014, now Pat. No. 9,921,263.

(60) Provisional application No. 61/806,900, filed on Mar. 31, 2013.

(51) Int. Cl.
*G01R 31/02* (2006.01)
*G01R 31/28* (2006.01)

(52) U.S. Cl.
CPC ........ *G01R 31/021* (2013.01); *G01R 31/2834* (2013.01)

(58) Field of Classification Search
CPC .. G01R 31/021; G01R 31/025; G01R 31/026; G01R 31/04; G01R 31/041
USPC ........................................ 324/539, 500, 537
See application file for complete search history.

(56) References Cited

U.S. PATENT DOCUMENTS

| | | | |
|---|---|---|---|
| 4,307,928 A | 12/1981 | Petlock, Jr. | |
| 4,316,259 A | 2/1982 | Albrecht et al. | |
| 4,321,532 A | 3/1982 | Luna | |
| 4,567,756 A | 2/1986 | Colborn | |
| 4,605,894 A | 8/1986 | Cox et al. | |
| 4,659,792 A | 4/1987 | Kashiwa et al. | |
| 4,689,551 A | 8/1987 | Ryan et al. | |
| 5,675,257 A * | 10/1997 | Frus | F02C 7/266 |
| | | | 324/380 |
| 6,192,496 B1 | 2/2001 | Lawrence et al. | |
| 6,910,924 B1 * | 6/2005 | Marion | H01R 13/2471 |
| | | | 324/756.05 |
| 7,112,969 B1 | 9/2006 | Thomas | |
| 7,248,035 B2 * | 7/2007 | Babcock | G01R 31/31924 |
| | | | 324/73.1 |

(Continued)

FOREIGN PATENT DOCUMENTS

WO    2012083420    6/2012

*Primary Examiner* — Giovanni Astacio-Oquendo
(74) *Attorney, Agent, or Firm* — Benoit & Cote, Inc.; C. Marc Benoit

(57) ABSTRACT

There is described a method for communicating between distributed test units testing a wire harness. The method comprises connecting a first test unit and a second test unit to the wire harness to test, acting as a master and a slave, and either identifying a wire that is good to communicate or sending a test signal through a circuit comprising a wire of the wire harness from the first test unit to the second test unit to identify such a wire. Then the first test unit sends a communication signal through the circuit comprising the wire of the wire harness from any one of the first test unit and the second test unit to the other one.

12 Claims, 11 Drawing Sheets

(56) References Cited

U.S. PATENT DOCUMENTS

| | | |
|---|---|---|
| 7,728,605 B2 | 6/2010 | Gervais |
| 2002/0147561 A1 | 10/2002 | Baracat et al. |
| 2010/0312517 A1 | 12/2010 | McNamara et al. |
| 2011/0080187 A1 | 4/2011 | Hotz et al. |

* cited by examiner

METHOD OF COMMUNICATION BETWEEN DISTRIBUTED WIRE HARNESS TEST UNITS USING WIRE UNDER TEST

CROSS-REFERENCE TO RELATED APPLICATIONS

This application is a continuation-in-part of patent application U.S. Ser. No. 14/230,988 filed Mar. 31, 2014, which claims priority of U.S. provisional patent application 61/806,900 filed Mar. 31, 2013, the specification of which is hereby incorporated herein by reference in its entirety.

BACKGROUND

(a) Field

The subject matter disclosed generally relates to automated testing equipment for wire harnesses.

(b) Related Prior Art

Circuit analyzers are Automated Test Equipment (ATE) used to validate the configuration and integrity of new electrical circuits being built in a manufacturing environment but also for testing existing electrical circuits in a maintenance environment. For illustration purposes, an electrical circuit consists of a multitude of test points originating from a connector going through an electrical medium such as wires, connectors, passive components, all of such connections linking to other terminations at either another connection point in a connector or a ground connection.

Under the current state of art, conventional Automated Test Equipment consist of one central processor in a test unit driving test signals and measuring test signals to validate the integrity of an electrical connection of the SUT. The test unit of the ATE needs to be connected to each and all of the connections points of the electrical circuit of the SUT in order to be able to validate the integrity of the configuration. This is how all of the test points in the electrical circuit of the system under test (SUT) are properly connected between them or a ground, and to validate the integrity such a circuit, that is that the connection is physically within specific electrical tolerances such as resistive value. These connections between the ATE and the SUT are generally performed with mating interface cable assemblies that are customized on one side with the ATE mating connector and on the other side the SUT mating connector. These interface cables require a lot of preparation to make sure that they are built to specific configurations, a process which is time consuming, costly and can be somewhat bulky (i.e., big and a large quantity).

In addition to the interface mating cables, a specific test program generally has to be made to the specific configuration of the ATE and the SUT, a process which is also time-consuming and costly. There are however new techniques which were developed to reverse engineer the SUT, also called auto-configuration or auto-learning, which is a test program that has the ability to drive signals on specific connections points while "listening" to pick up such signal at all of the other interconnect points, to determine the interconnectivity of the electrical circuit of the SUT, and the ability to provide a report on a wire-to-wire and wire-to-ground interconnectivity of all connections points.

The present state-of-art therefore requires fully customized interface cables with an associated test program that has the ability to make a validation of the configuration and integrity of the electrical circuit of the SUT. Under the present state-of-art, the ATE will generate a signal, one at a time, to each and all connection points, and sequentially find any and all linked connections by having a method to capture transmitted signals, such as 'listening' for the emitted signal, or an indicative method such as a light or sound to measure the connection. Once all connections are detected and the circuit is validated, the ATE will have the ability to measure the resistive values of the connections by measuring the wire-to-wire or wire-to-ground.

One of the main limitations of the existing art is the complexity of testing specific electrical circuit when each individual SUT is different from others for example, in a manufacturing environment where each SUT is customized to unique configuration, or in a maintenance environment where testing of a specific electrical circuit may not be predictable in view of the uncertainty of a failure. In such cases, the complexity created by the large number and diversity of connectors that requires extensive preparation to configure each interface cable and test program, in addition to adding more testing points to the overall ATE to detect all possible interconnection permutations between them, is not efficient and too costly to make the process of using ATE economically viable.

There is therefore a need to develop a new method and apparatus to automate the creation of generic interface connectors and test programs to reduce the time and costs associated with such operations.

SUMMARY

Over the last decade, a new generation of ATE was developed with distributed test units that provided opportunities to reduce the footprint of the interface cables required to interconnect to the SUT (where the wire harness is the subject under test). These ATE have a central processor controlling and receiving test results over a wired or wireless network communication with two or more individual test units connected to the SUT. Each test unit has the capability to send test signals to or read test signals from the SUT to evaluate its electrical characteristics, or to do both, i.e., send and read test signals from the SUT. A limitation of distributed test systems was found when working on large ship or building where the wireless network infrastructure was not strong enough or not desirable by the end user to permit good communications between the ATE central processor and the distributed test units, even using wireless repeaters. A similar limitation was also found with wired network infrastructure for cost, time and other considerations, especially in the construction of such large ships and building.

The present invention is a communication method which can alleviate these inconveniences by providing communication methods when two or more distributed test units are required to validate the integrity of an electrical harness. The concept is to use at least one of the wire under test to control either a slave connector or a slave test unit that will have the capability to read electronic signals to identify that a wire is connected between a master test unit and a slave connector or slave test unit, as well as capabilities to send test commands and receive test results between a master test unit and a slave connector or slave test unit (both of which are described below) through the wire(s) of the harness under test. All of these features will translate into new capabilities that will permit the rapid deployment of an ATE with distributed test units with no existing communication infrastructure other than the SUT harness assembly or electrical system that is being build and need to be tested. The main concept is easily deployed if the user knows that at least one of the wire of the SUT is functional and can be used for the communication for the ATE purposes. But more importantly, if the SUT assembly under test detailed specifications are not available or are uncertain, the features of adding electronic identification to specific communication channels on the slave connector or slave test unit will provide capabilities to identify at least one wire of the SUT that can be used to communicate among the master and the slave connector or slave test unit.

The proposed ATE is used to validate the interconnection by having a master test unit interrogating from a source node each of the connection to detect and read electronic ID that will provide termination mode identification, or any other electrically-accessible identifier from the slave connector or the slave test unit. Alternatively, to identify the channel of the internal slave connector or slave test unit, there can be provided an FPGA, a micro-controller or any other type of electronic device that are often incorporated in the design of test units. Other options will include ability to switch off the memory or microcontroller or FPGA to get a clear path to a multiplexer or a path leading to a ground or another method to measure resistance.

According to an embodiment, there is provided a method to create generic mating interface cables that have the ability to connect to electronic slave connectors, a new generation of connectors that have an EEPROM connected to each of its connection points so that a master ATE can unidirectionally send a signal to interrogate and read each of the memory devices to extract the information about the connector layout, and therefore identify the specific link connection, without having to have the terminating connections directly link to the ATE, and eliminating the need for specific test programs to use specific interface cables. In addition, such electronic slave connector will have the ability to connect to the ground so that the ATE can measure the resistive value of the terminating connection with an acceptable level of precision to validate the integrity of the connector.

In an aspect of the invention, there is provided a connector for use with a harness under test by an automated test equipment (ATE), the harness being electrically connected to a reference, the connector comprising: connection points having a layout, namely a connector layout; electronic identifiers, each one of the electronic identifiers being connected to a respective one of at least a portion of the connection points; a switch for one of: connecting the ATE to the reference via the electronic identifiers; and connecting the ATE to the reference while bypassing the electronic identifiers.

According to an embodiment, connecting the ATE to the reference via the electronic identifiers is for identifying a link connection between two terminating connections without having to have the terminating connections directly link to the ATE.

According to an embodiment, connecting the ATE to the reference while bypassing the electronic identifiers is for evaluating a quality of a link connection to a terminating connection.

According to an embodiment, the electronic identifier contains information for identifying a position of the connector.

According to an embodiment, the electronic identifier comprises a read-only memory.

According to an embodiment, the electronic identifier comprises an EEPROM.

According to an embodiment, the connector is adapted for connection with a standard interface cable, which is for connection to a second ATE.

According to an embodiment, the switch comprises one of: a manual switch, an electronic switch, a MEMS switch, a transistor, and a switch embedded in an electrical circuit board.

In another aspect of the invention, there is provided a method for testing a wire harness with an automated test equipment (ATE), the method comprising: sending a signal through a circuit comprising a wire; if an electronic identifier is present on the circuit, reading the electronic identifier; switching a switch on the circuit to connect the ATE to a reference while bypassing the electronic identifier; and sending a signal and measuring an electrical characteristic of the circuit for evaluating a quality of the circuit.

According to an embodiment, there is further provided, prior to switching, repeating sending a signal for a plurality of wires.

According to an embodiment, there is further provided, after switching, repeating sending a signal and measuring an electrical characteristic of the circuit for a plurality of wires.

According to an embodiment, there is further provided, after reading the electronic identifier, querying in a database about the identity of the electronic identifier.

According to an embodiment, there is further provided listing connections between terminations based on the identity of the electronic identifier of each wire.

According to an embodiment, measuring an electrical characteristic comprises measuring a resistance.

According to an embodiment, evaluating a quality of the circuit comprises comparing the resistance that is measured with a threshold to deduce the presence of defects on the circuit.

Present Mode of Operation ATEs validate continuity and identify specific interconnections (wire-wire, wire-ground) in an electrical circuit by sending a signal on a source node and having a 'detector' at the termination node.

According to an embodiment, there is described a method for communicating between distributed test units used in testing a wire harness, the distributed test units comprising a first test unit and a second test unit, the method comprising: electrically connecting the first test unit and the second test unit to the wire harness under test; sending a communication signal through a circuit comprising a wire of the wire harness from any one of at least one node of the first test unit and at least one node of the second test unit; and establishing, by using the communication signal, a communication between the distributed test units.

According to an aspect, the method further comprises at least one of: determining that the wire is suitable for communicating prior to sending the communication signal; and sending a test signal through the circuit from the first test unit to the second test unit, to identify that the wire is suitable for communicating.

According to an aspect, determining that the wire is suitable for communicating comprises: if an electronic identifier is present on the circuit, reading the electronic identifier by the first test unit; switching a switch on the circuit to connect the first test unit to a reference of the second test unit while bypassing the electronic identifier; and sending a signal by the first test unit and measuring an electrical characteristic of the circuit for evaluating a quality of the circuit.

According to an aspect, the method further comprises, after reading the electronic identifier, querying a database about an identity of the electronic identifier.

According to an aspect, the method further comprises listing connections between terminations based on the identity of an electronic identifier of each wire.

According to an aspect, determining that the wire is suitable for communicating comprises: if an electronic identifier is present on the circuit, reading the electronic identifier by the second test unit; and sending a signal to the first test unit to advise on which wire to communicate test commands and test results between the distributed test units.

According to an aspect, the method further comprises, after reading the electronic identifier, querying a database about an identity of the electronic identifier.

According to an aspect, the method further comprises listing connections between terminations based on the identity of an electronic identifier of each wire.

According to an aspect, sending a communication signal comprises sending any one of a test command and a test result recognizable by the distributed test units.

According to an aspect, electrically connecting the first test unit and the second test unit comprises electrically connecting a master test unit and a slave test unit respectively.

According to an aspect, electrically connecting the second test unit comprises electrically connecting a slave connector with an identifier for each individual node and the method further comprising communicating, by the slave connector, through the wire harness under test.

According to an aspect, sending the communication signal through the circuit comprises modulating or encoding the communication signal to transmit information.

Features and advantages of the subject matter hereof will become more apparent in light of the following detailed description of selected embodiments, as illustrated in the accompanying figures. As will be realized, the subject matter disclosed and claimed is capable of modifications in various respects, all without departing from the scope of the claims. Accordingly, the drawings and the description are to be regarded as illustrative in nature, and not as restrictive and the full scope of the subject matter is set forth in the claims.

BRIEF DESCRIPTION OF THE DRAWINGS

Further features and advantages of the present disclosure will become apparent from the following detailed description, taken in combination with the appended drawings, in which.

It will be noted that throughout the appended drawings, like features are identified by like reference numerals.

DETAILED DESCRIPTION

Figure 1:
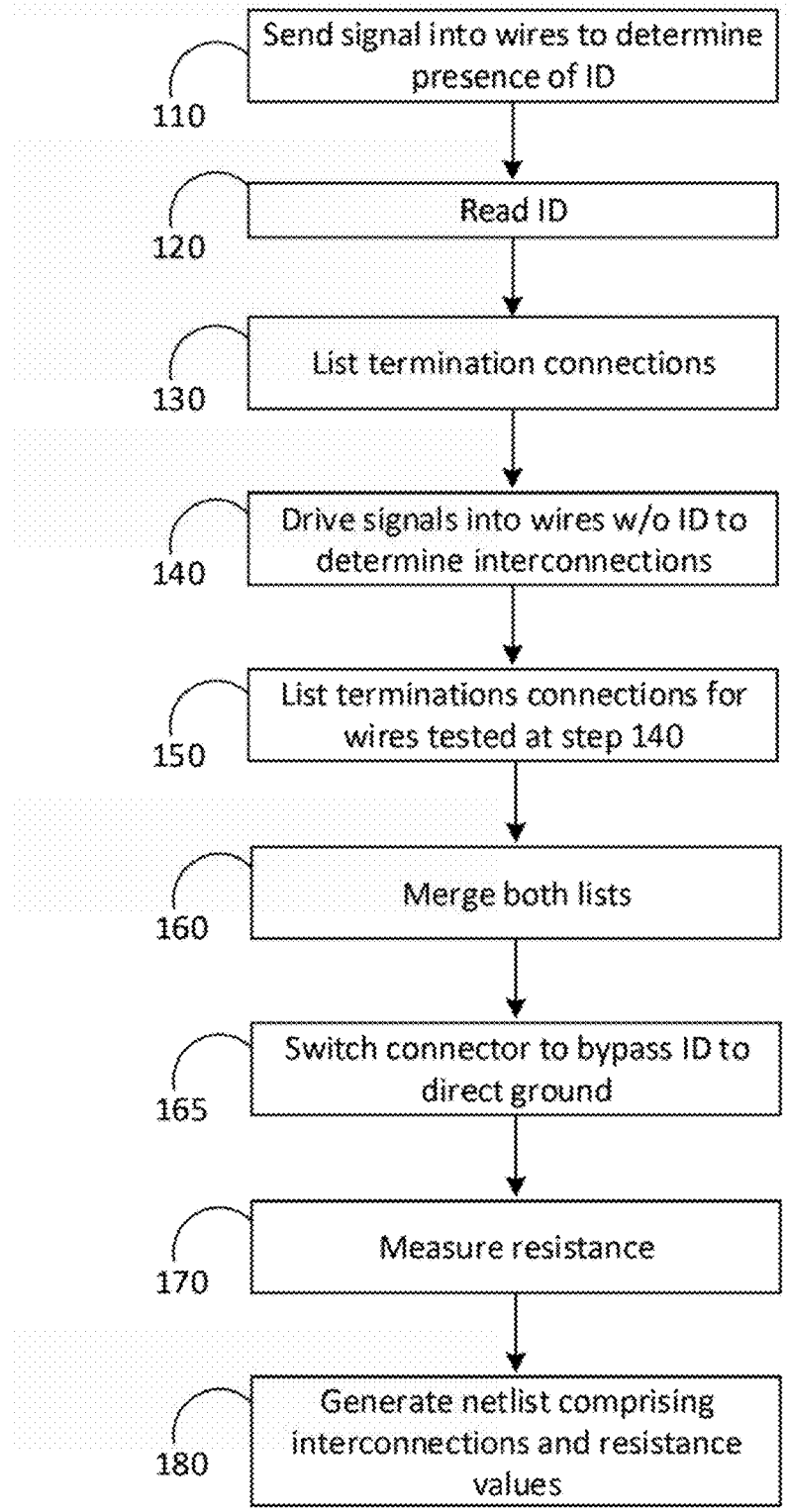
FIG. 1 is a flowchart illustrating the method for reading electronic identifiers and listing interconnections, according to an embodiment.

According to an embodiment, steps to build interface cables include:

Step 1: Identify list of connector model on the SUT (i.e., the wire harness);

Step 2: For each connector identified in 1, determine the opposite mating connector;

Step 3: Determine if the mating connector in 2 is available on an existing interface cable in the inventory;

Step 4: If none are found in 3, create a new interface cable;

Step 5: Create an identification of the mating assembly so that it can be recognized by an ATE by any or a combination of the following methods:
  a. A standard number for the mating assembly;
  b. A unique serial number to the mating assembly;
  c. Incorporating a medium to read the information about the mating assembly;
    This identification method can be done manually or it can be created into a database;

Step 6: Except if 5c was performed, the final mating assembly must be registered so that it can be recognized by the ATE in order to be able to use it on the SUT. It can be done manually or it can be created by a software in various ways, including:
  a. Adding the mating assembly to the ATE library the design layout of the mating assembly;
  b. Adding the mating assembly to a standard database;

Step 7: Once recognizable by the ATE, the mating assembly can be shipped to the location where it is needed by the technician for the test/maintenance on the SUT, and at that point, it will generally need to be validated prior to the first utilization to make sure that it respects the specifications of connector on the SUT;

Step 8: Another step generally required to operate the ATE is to use a test program that incorporates one or many interface mating cables and requires engineering or technician skills to ensure that the test signals sent to the SUT are appropriately sequenced on the specific connections points of any or all of the connectors;

Step 9: The test program must also be identified in a manner similar to step 8;

Step 10: The test program must also be delivered to the location of the test/maintenance and validated prior to its first utilization to ensure that it respects the specifications of the test requirements and that it was made by an approved entity listed in step 11;

Step 11: The ATE can then perform the test by:
 a. Identifying each mating connector hooked to the ATE and related mate;
 b. Send test signals, one at a time to one originating connection and capture the signal by the receiver method on each of the terminating connections, repeating the operation to each of the connections as an originating connection until all connections have been tested;
 c. Merging the test results to create a netlist of connections;
 d. Make a resistance measurement of all of the connections;
 e. Create a report.

One driver of the embodiments described below is the ability for an ATE to detect and identify a link between two connection points of an electrical circuit with only one of the two connections, the originating node, being directly connected to the ATE by an interface cable, the terminating node being connected to an electronic slave connector that has embedded EEPROM (electrically erasable programmable read-only memory), the memory containing the layout characteristics and other information about the connector under test so that the link can be positively identified to a specific electrical node of the circuit.

It should be noted that even though embodiments described above use an EEPROM as an identifier for a connection point, the EEPROM can be replaced by other types of electrically-accessed memories. Non-volatile memories such as read-only memories or flash memories can be used as identifiers, as well as magnetic memories. Other identification means, such as circuit elements having very precise characteristics (such as a precise resistance or inductance) can be used as an identifier on a circuit. Many types of electronic identifiers are therefore suited for the identification of a connection point including, without limitation, micro-controllers, FPGA and other circuitry.

Figure 2:
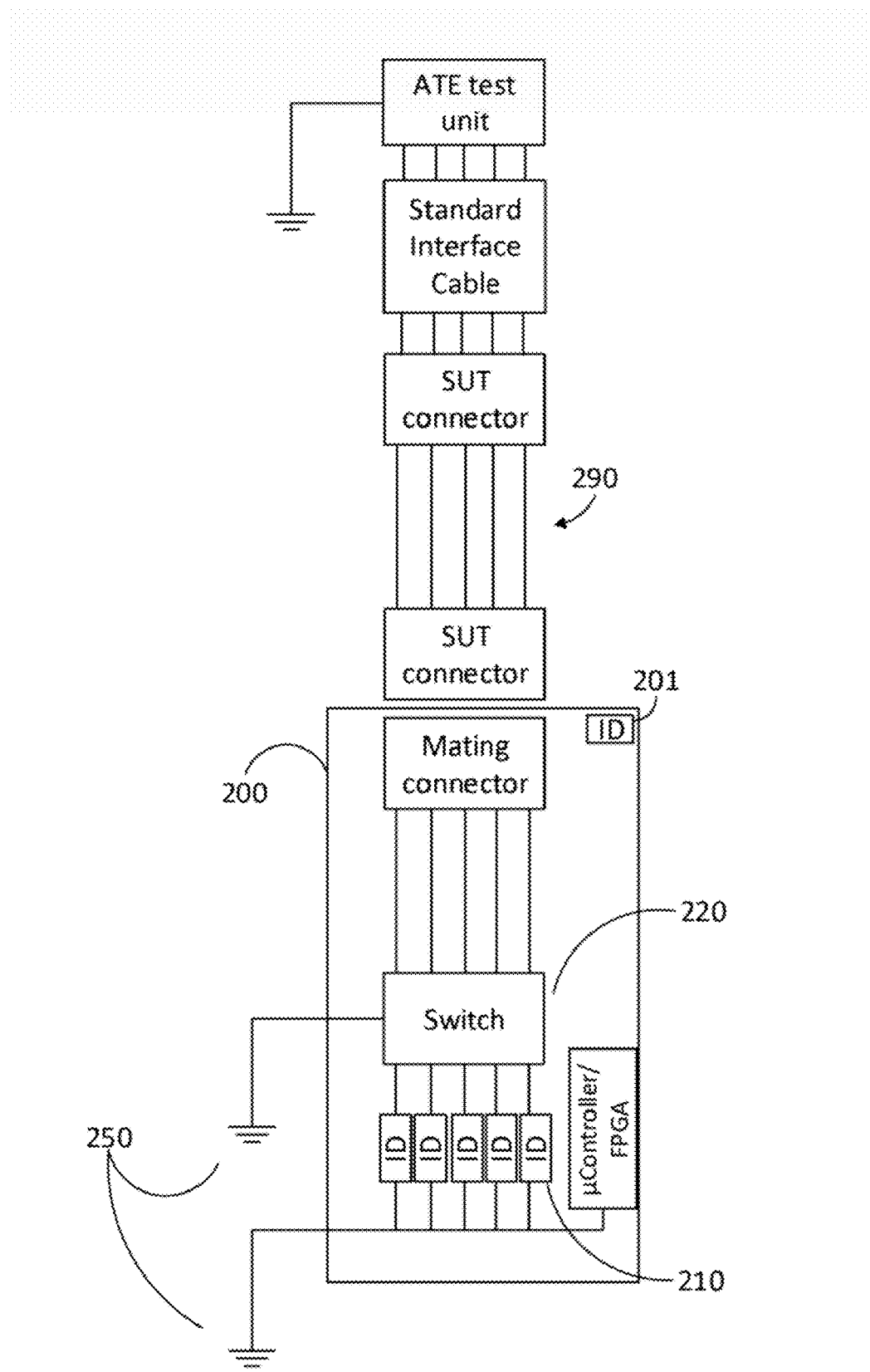
FIG. 2 is a block diagram illustrating a master test unit and a slave connector connected to the wire harness under test, according to an embodiment.

Now referring to FIG. 1, the testing method can be described as follows:

First, the ATE will interrogate one by one each of the originating node, by sending a signal into the wire, to determine if a link can be made with an EEPROM (step 110);

Then, if a link can be made with an EEPROM, the ATE will read EEPROM and identify the link of the terminating connection (step 120), either by: reading the information of the termination connection on the EEPROM; or by retrieving the information associated with the EEPROM identification of the termination connection from a central database;

The ATE will compile a list of termination connections with an EEPROM list for merging into a netlist database (step 130);

The ATE will use conventional methods of driving signals to all originating connections who have been determined not to have a connection with the EEPROM list to determine other interconnections within the electrical circuit (step 140);

The ATE will compile a list of termination connections of the type wire-to-wire or wire-to-ground that have not an EEPROM on the circuit (step 150);

The ATE will merge the result obtained in steps 130 and 150 to create a final netlist configuration of the electrical circuit (step 160);

In the case in which there is a slave connector connection, the ATE will execute a command to remove the EEPROM from the circuit to make a direct connection to the ground (step 165). The ATE will proceed to read the resistive values of each node to determine quality of connection (step 170), by measuring resistance on a wire-to-wire or wire-to-to ground connection;

ATE will merge the results in steps 160 and 170 to produce a final netlist configuration of the electrical circuit with resistive values of wire-to wire or wire-to ground connections (step 180);

According to an embodiment, the connector 200 for performing the method on a wire harness 290 can be described as follows, referring to FIG. 2.

The slave connector 200 has an EEPROM 210 for each connection point, or at least for each one of a portion of the connection points. The EEPROM has a unique ID and may contain any other information that can be used to identify the specific position of the slave connector contact layout. According to an embodiment, the slave connector 200 itself has an ID 201 so it can be identified prior to, during or after testing.

A switch 220 to provide the ability to connect the node to the EEPROM or to a direct ground 250, in the first case to identify the wire, and in the second case to be able to measure the resistive value to ground 250; this switch 220 may take the form of a manual or electronic switch (e.g. a transistor, a MEMS switch or the like), or be embedded in an electrical circuit board with other functions.

In other words, for a given wire linking two terminal connections of the wire harness 290, an ATE is placed at one of these terminal connections, and a slave connector is placed at the other one. For each one of the wires being tested, a signal is sent by the ATE into the circuit comprising the wire, and goes through an identifier (such as an EEPROM) to the electrical ground 250 (if no slave connected is provided at a given terminal connection, the conventional testing procedure applies). When the identifier is provided on the circuit, it allows extracting information therefrom, that can be used in a database to verify the identity or position of the connector. After this is done, a switch can bypass the identifier so that the ATE is directly linked to the electrical ground 250 (i.e. the signal does not go through the identifier). The resistance (or any other electrical characteristic) of the circuit can be measured. This measure allows evaluating the quality of the link between the two terminal connections, for example if there is a defect in the circuit by comparing resistance thresholds in a database, for example.

According to an embodiment, there is an option to connect all the wires of the slave connector to a generic mating interface cable 230, also known as a standard interface cable, that would have on one hand, a generic connector for the slave connector, and on the other hand, a connector to mate with the connector of another ATE. The option would permit the use of the slave connector as if it was a standard mating interface assembly to be used with such another ATE. This way, ATEs can be used in a conventional manner.

According to an embodiment, the slave connector 200 is not connected to the usual ground 250, but rather to another reference which differs from the ground 250 from a constant voltage or a known value. Generally speaking, the slave connector 200 is thus said to be electrically connected to a reference.

Figure 4:
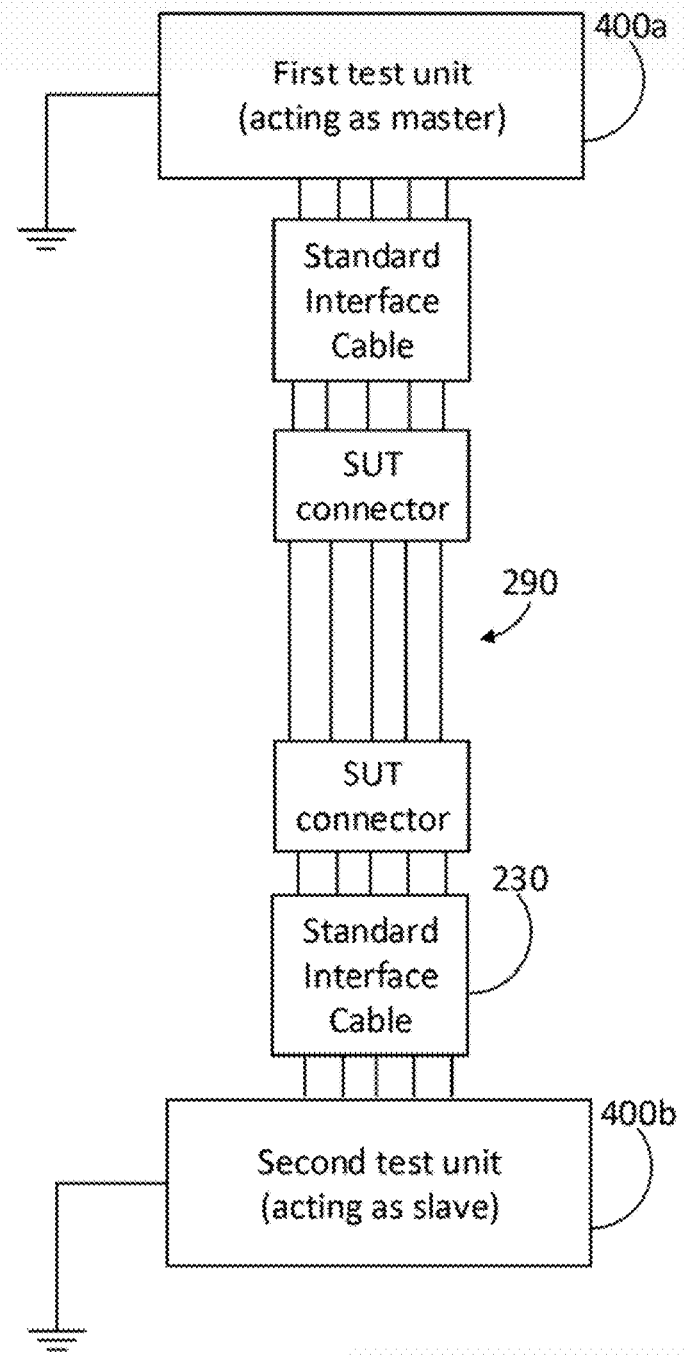
FIG. 4 is a block diagram illustrating a master test unit and a slave test unit connected to the wire harness under test, according to an embodiment

Now referring to FIG. 4, and according to another embodiment, there is shown a system in which there is no independent and distinct slave connector 200. Instead, the functionalities described above in reference to the slave connector are integrated to a test unit acting as a slave tester, preferably into a plurality of test units, and to be interrogated by another test unit (i.e., the master test unit).

The master test unit, or first test unit, is used by the ATE (which is a central computer managing the test) to connect to the SUT and send/receive signals to/from the slave test unit. The presence of more than one of the test unit makes the system distributed. The computer of the ATE manages netlists and other related information, and is normally handled by the test operator. According to an alternative embodiment, the functions of the ATE may be incorporated into the master test unit.

In this embodiment described below, the test unit is able to detect and identify a link between two connection points of an electrical circuit with only one of the two connections, the originating node, being directly connected to a first test unit (i.e., acting as the master test unit) by an interface cable, the terminating node being connected to a second test unit (i.e., acting as the slave test unit), acting as a slave test unit and that has is able to identify a wire being used. For example, an electronic identifier such as an EEPROM (as described above), a FPGA, a multiplexer, or any other suitable microcontroller can be used. The identifier can contain the layout characteristics and other information about the connector under test so that the link can be positively identified to a specific electrical node of the circuit.

The identifier in the test unit acting as the slave test unit is preferably a FPGA or another microcontroller having a processor able to generate an identification for the current channel being used by the master test unit. The FPGA in a test unit can identify which channel is being used for testing, i.e., which wire in the harness is being used to receive the incoming test signal from the master test unit.

Figure 3:
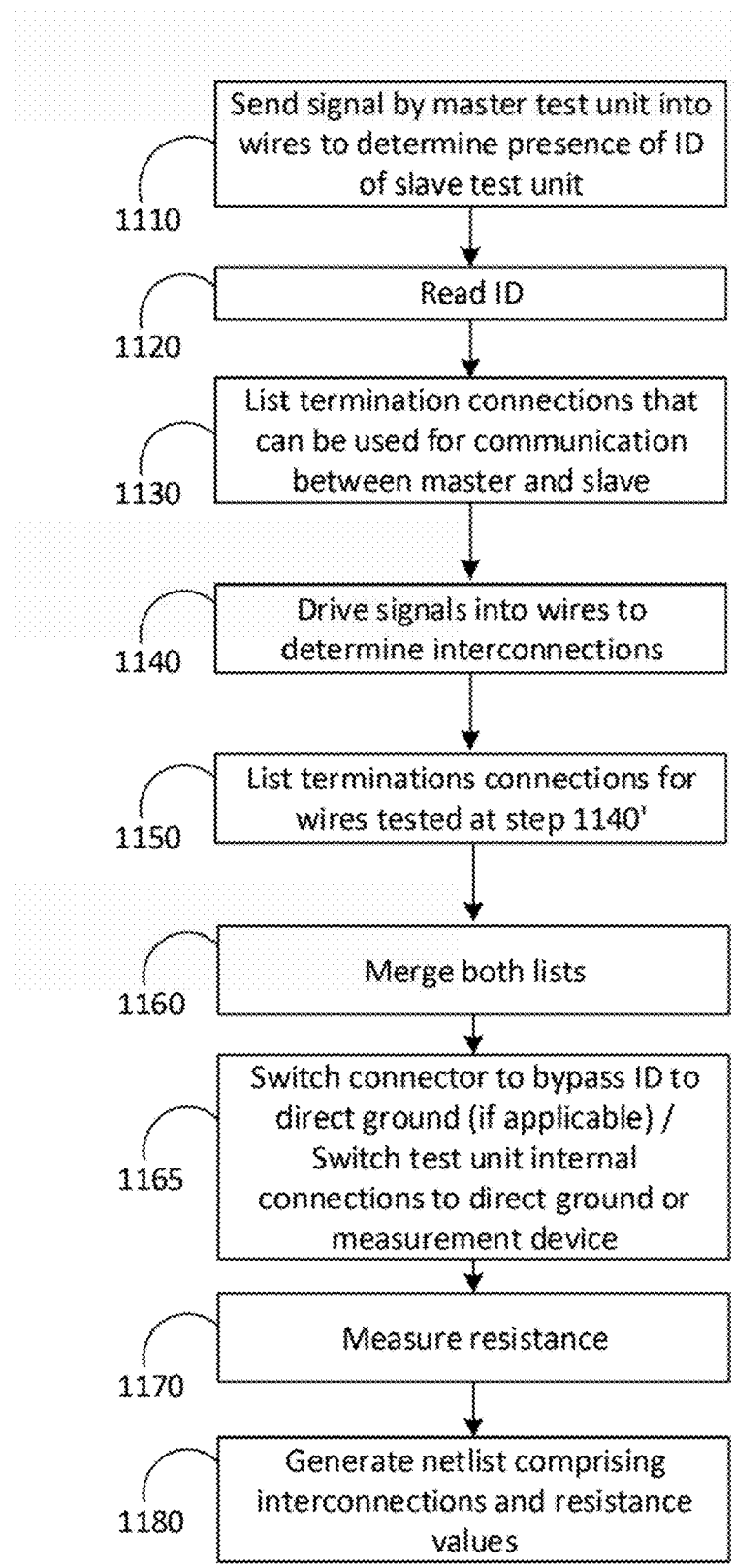
FIG. 3 is a flowchart illustrating the method for reading electronic identifiers and listing interconnections, according to an embodiment in which there is a slave test unit.

Now referring to FIG. 3, the testing method with master and slave test units can be described as follows. It should be noted that it is the central processor of the ATE, as described above, that controls all commands and compiles all results, the master unit usually being separate from the central processor of the ATE and thus being an intermediate to communicate, through the wire(s), with the slave test unit or slave connector. This central processor of the ATE can be incorporated into the master test unit instead of being in a distinct computer.

First, the first test unit acts as the master test unit and thus interrogates one by one each of the originating nodes, by sending a signal into the wire, to determine if a link can be made with the electrically-accessible identifier (e.g., FPGA) of a second test unit acting as a slave test unit (step 1110).

Then, if a link can be made with an electrically-accessible identifier (e.g., FPGA of the slave test unit), the slave test unit will recognize the channel of the signal, identify the link of the terminating connection (step 1120 and also steps 720, 730 and 740 in FIG. 5) and reply to the master using that link (the one identified as being suitable for communication) for actual communication of the identification result to the master test unit.

The second unit acting as a slave unit will transmit the information of the termination connection to the first/master test unit. This termination will be used for the test sequence by the central processor to communicate all commands to the slave unit and report back all results from the slave unit toward the central processor, by communicating on the wire of the SUT identified as being suitable for communication to the first unit acting as the master unit.

From then, the central processor will start its normal test sequence generally used for testing cables, including testing all nodes originating from any tester to ground, testing all nodes originating from any tester to all other nodes from all testers such as to determine the list of terminations connections of the SUT.

Therefore, the central processor will send various commands to the master tester to drive and measure signals, as well as similar commands to the slave tester via the communication already established, so that all possible interconnections to the ground, or to any node, are validated.

Both the master test unit and slave test unit(s) will use conventional methods of driving signals to all originating connections to determine other interconnections within the electrical circuit (step 1140).

The first test unit acting as the master test unit, or the central processor of the ATE, will compile a list of termination connections for merging into a netlist database (step 1130).

The first test unit or the central processor of the ATE will compile a list of termination connections of the type wire-to-wire or wire-to-ground that have a memory on the circuit (step 1150).

The first test unit or the central processor of the ATE will merge the result obtained in steps 1130 and 1150 to create a final netlist configuration of the electrical circuit (step 1160).

In the case in which there is a slave test unit connection, the first test unit will execute a command to remove the memory from the circuit to make a direct connection to the ground (step 1165). This step requires a communication between the first test unit and the second test unit. This communication will be described further below. The ATE will proceed to read the resistive values of each node to determine quality of connection (step 1170'), by measuring resistance on a wire-to-wire or wire-to-to ground connection.

The first test unit will merge the results in steps 1160 and 1170 to produce a final netlist configuration of the electrical circuit with resistive values of wire-to wire or wire-to ground connections (step 1180).

According to an embodiment, the second test unit is connectable to a wire harness 290 (i.e., the subject under test, SUT) for testing. The connection of two test units (the first being a master and the second acting as a slave) can be described as follows, referring to FIG. 5.

For a given wire linking two terminal connections of the wire harness 290, a first test unit 400*a* is placed at one of these terminal connections, acting as the master, and a second test unit 400*b* is placed at the other one, acting as the slave. For each one of the wires being tested, a signal is sent by the first test unit into the circuit comprising the wire, and goes through an identifier. When the identifier is provided on the circuit, it allows extracting information therefrom, that can be used in a database to verify the identity or position of the connector. The resistance (or any other electrical characteristic) of the circuit can be measured. This measure allows evaluating the quality of the link between the two terminal connections, for example if there is a defect in the circuit by comparing resistance thresholds in a database, for example.

According to an embodiment, both the first test unit and the second test unit can be interchanged. It implies that acting as a master and a slave is only circumstantial since these roles can be interchanged.

According to an embodiment, there can be more than two test units (e.g., three), which can all change roles (one is a master and all the others are slaves) when required.

Figure 8:
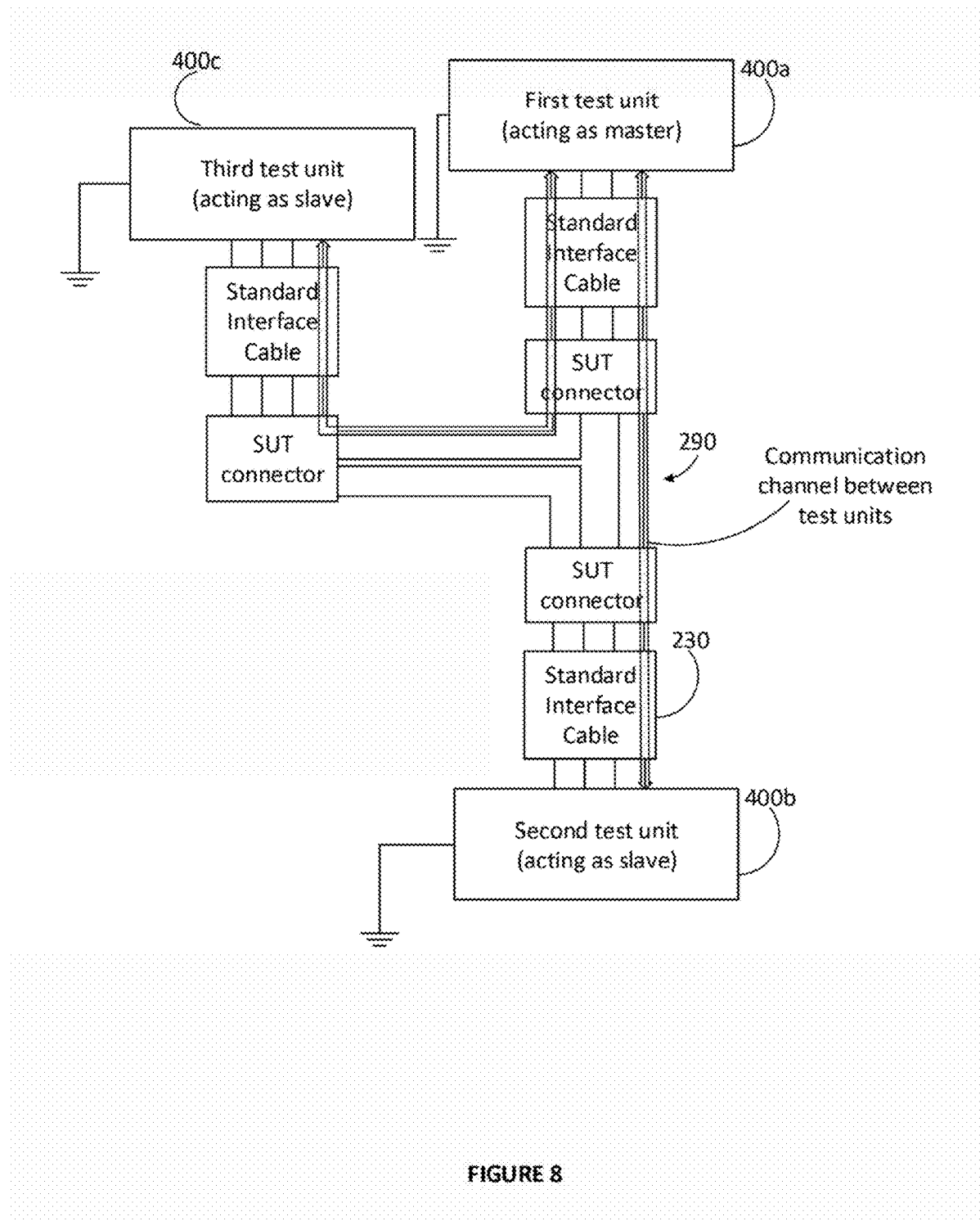
FIG. 8 is a block diagram illustrating a master test unit and two slave test units connected to the wire harness under test and communicating through the wire harness under test, according to an embodiment.
Figure 9:
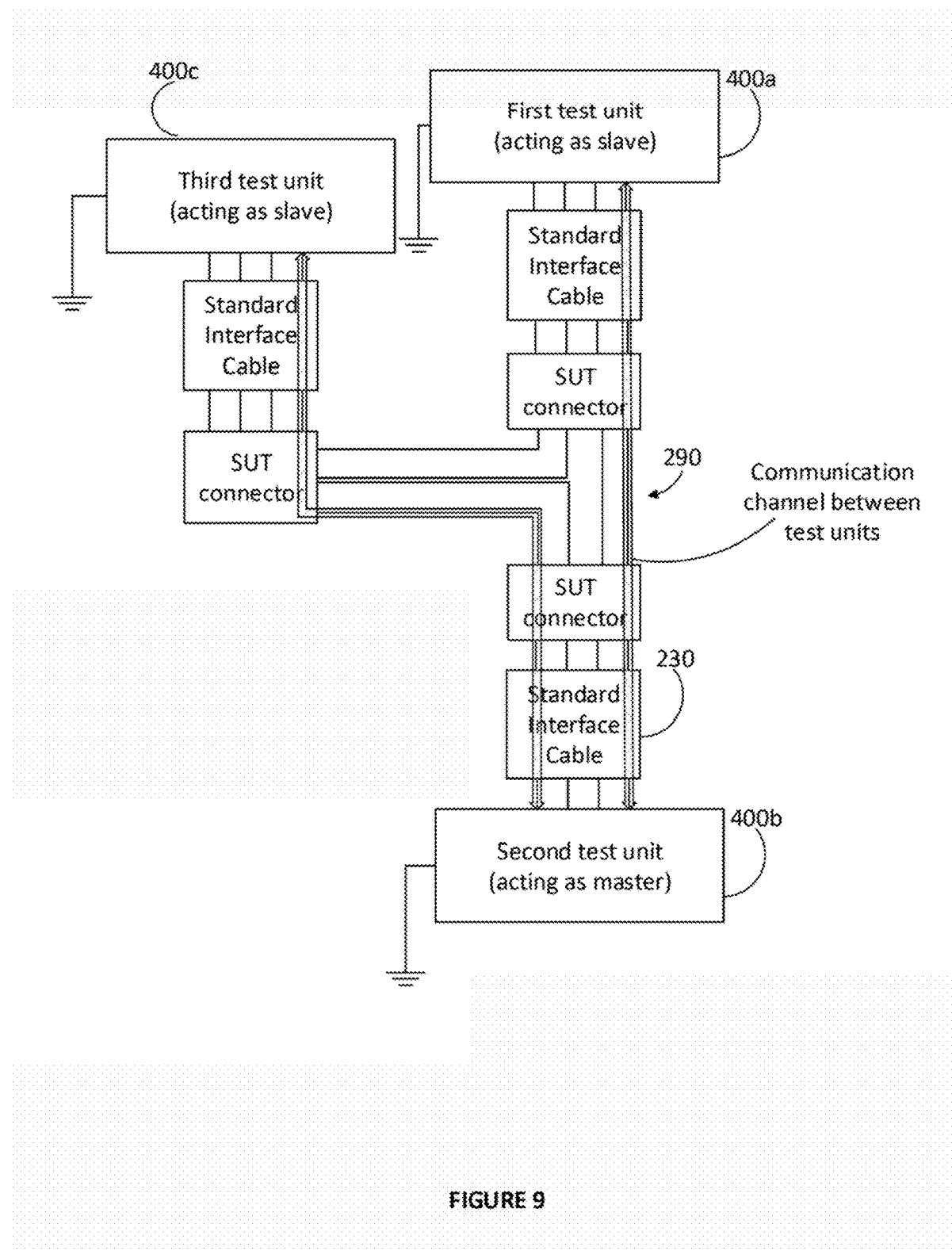
FIG. 9 is a block diagram illustrating the test units of FIG. 8 with interchanged roles, according to an embodiment.
Figure 10:
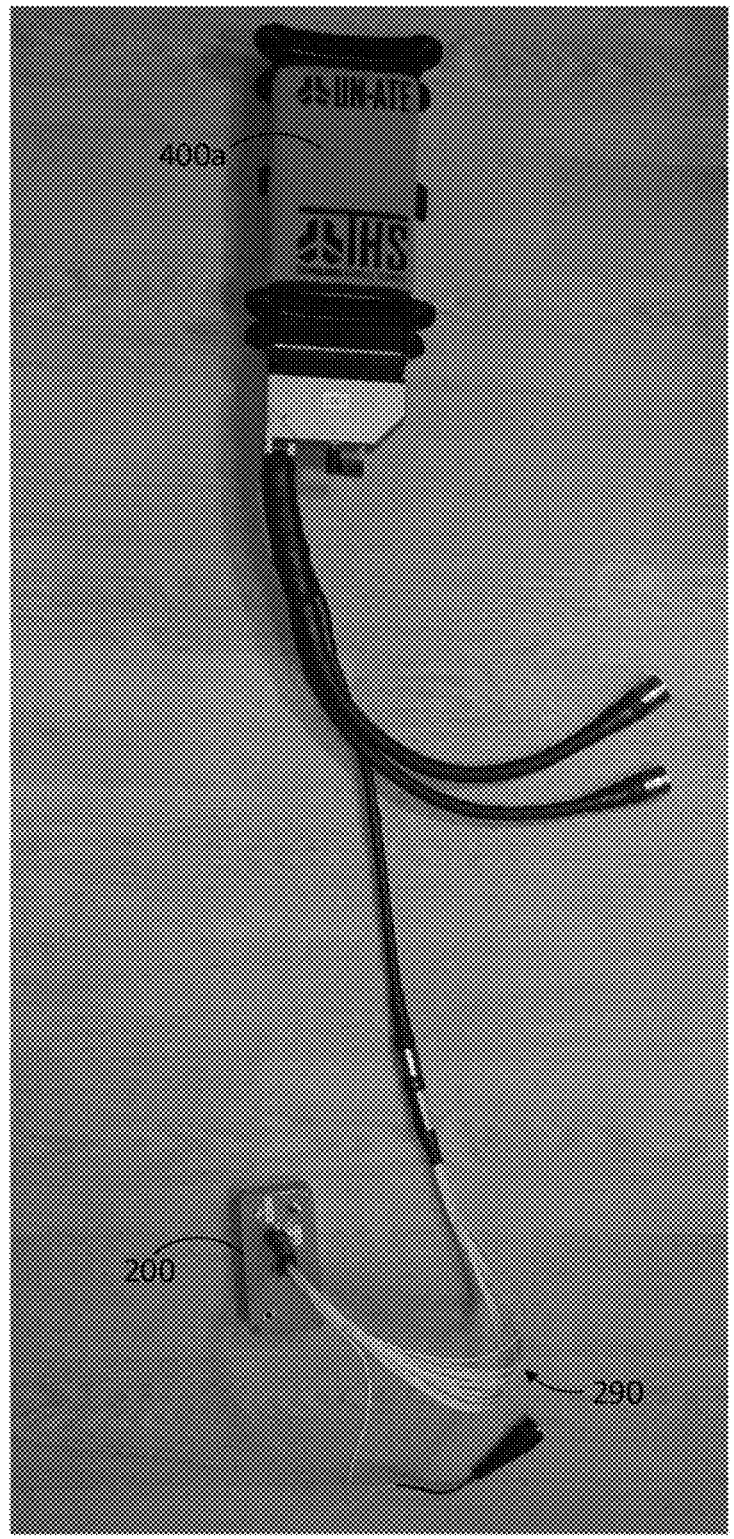
FIG. 10 is a picture illustrating a master test unit and a slave connector connected to the wire harness under test, according to an embodiment.
Figure 11:
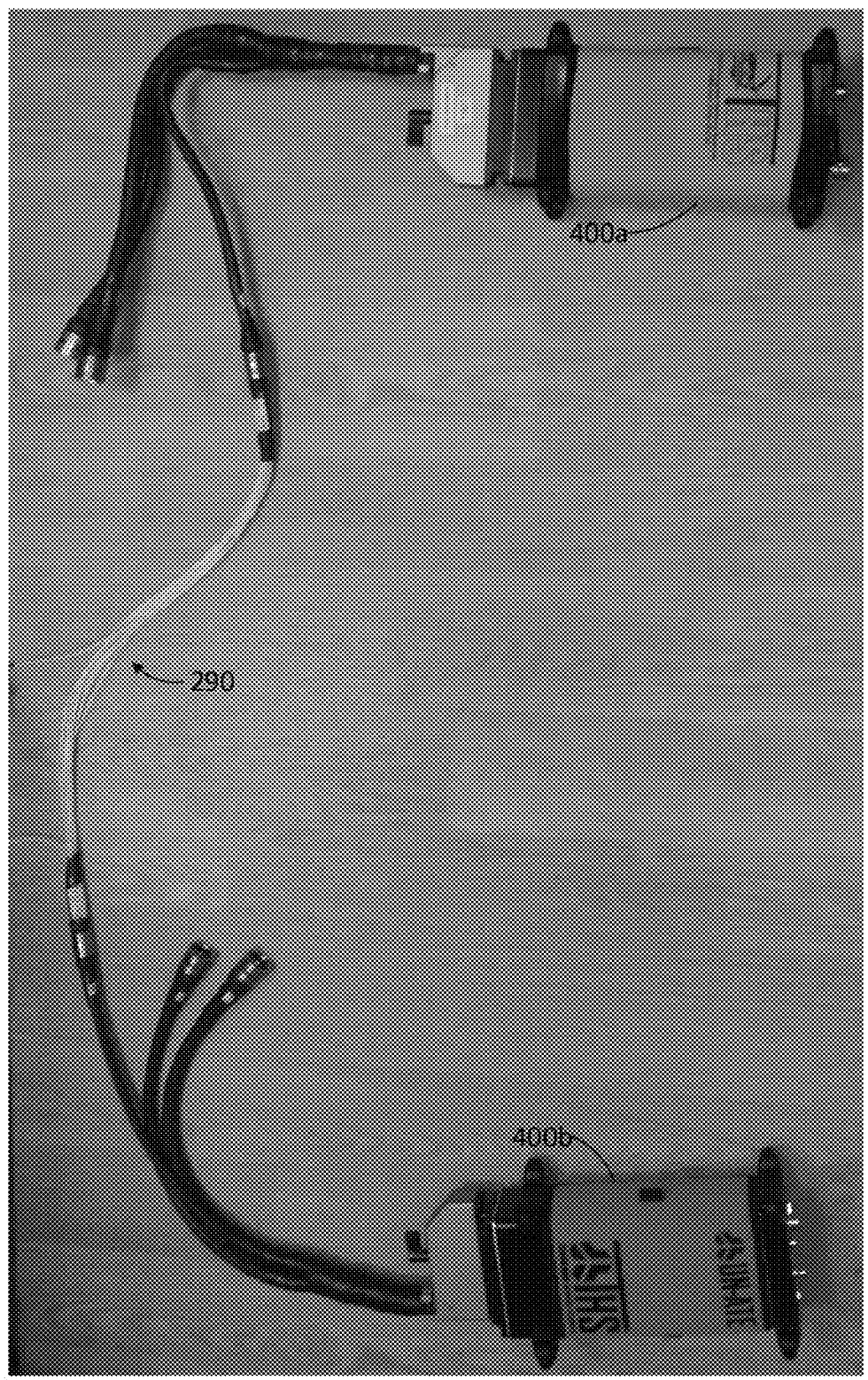
FIG. 11 is a picture illustrating a master test unit and a slave test unit connected to the wire harness under test, according to an embodiment.

FIGS. 8-9 show a case where there are more than two test units, i.e., in addition to the first test unit 400*a* and the second test unit 400*b*, there is provided a third test unit 400*c*. Roles can be changed, as shown in FIG. 9.

Figure 6:
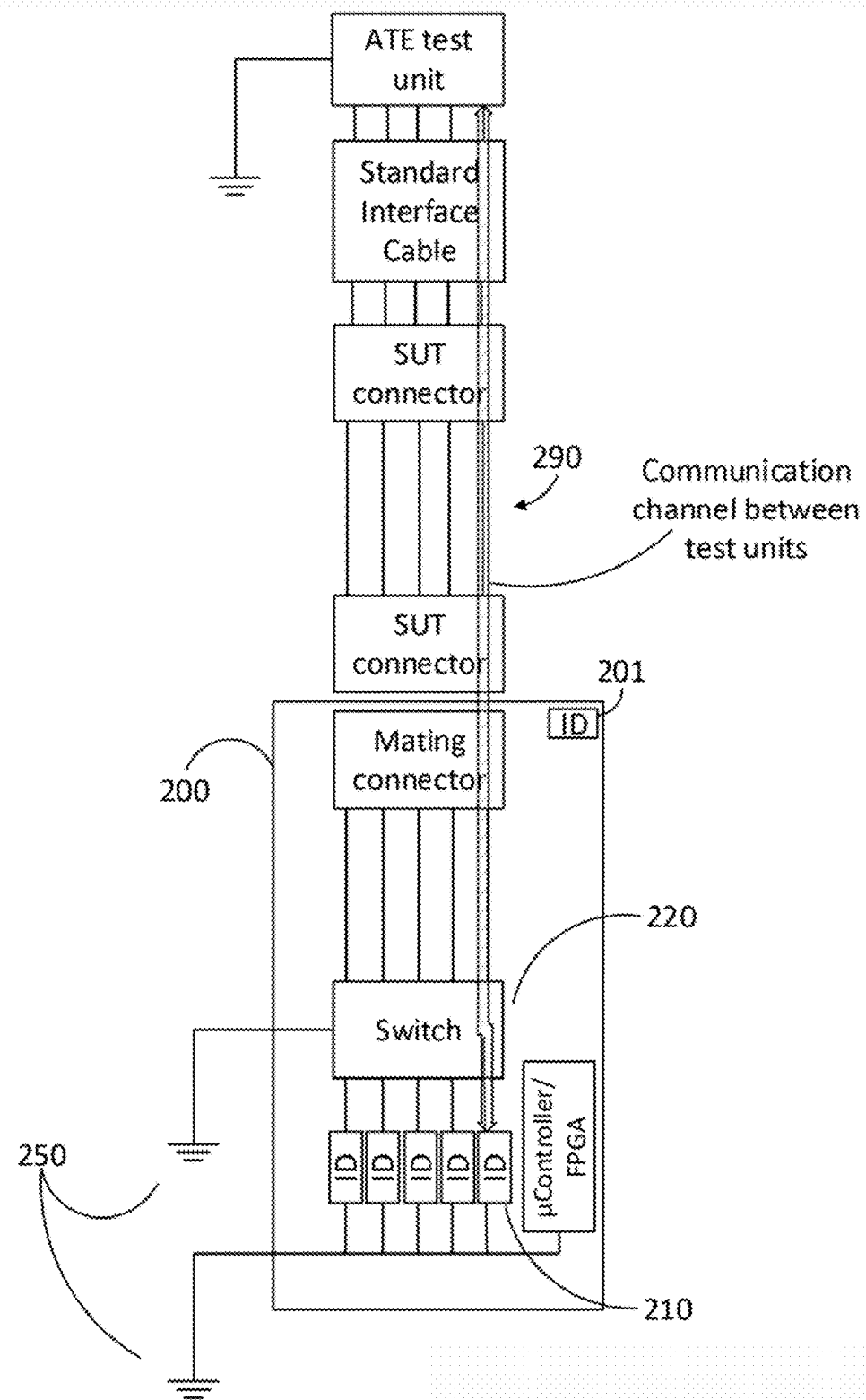
FIG. 6 is a block diagram illustrating a master test unit and a slave connector connected to the wire harness under test and communicating through the wire harness under test, according to an embodiment.
Figure 7:
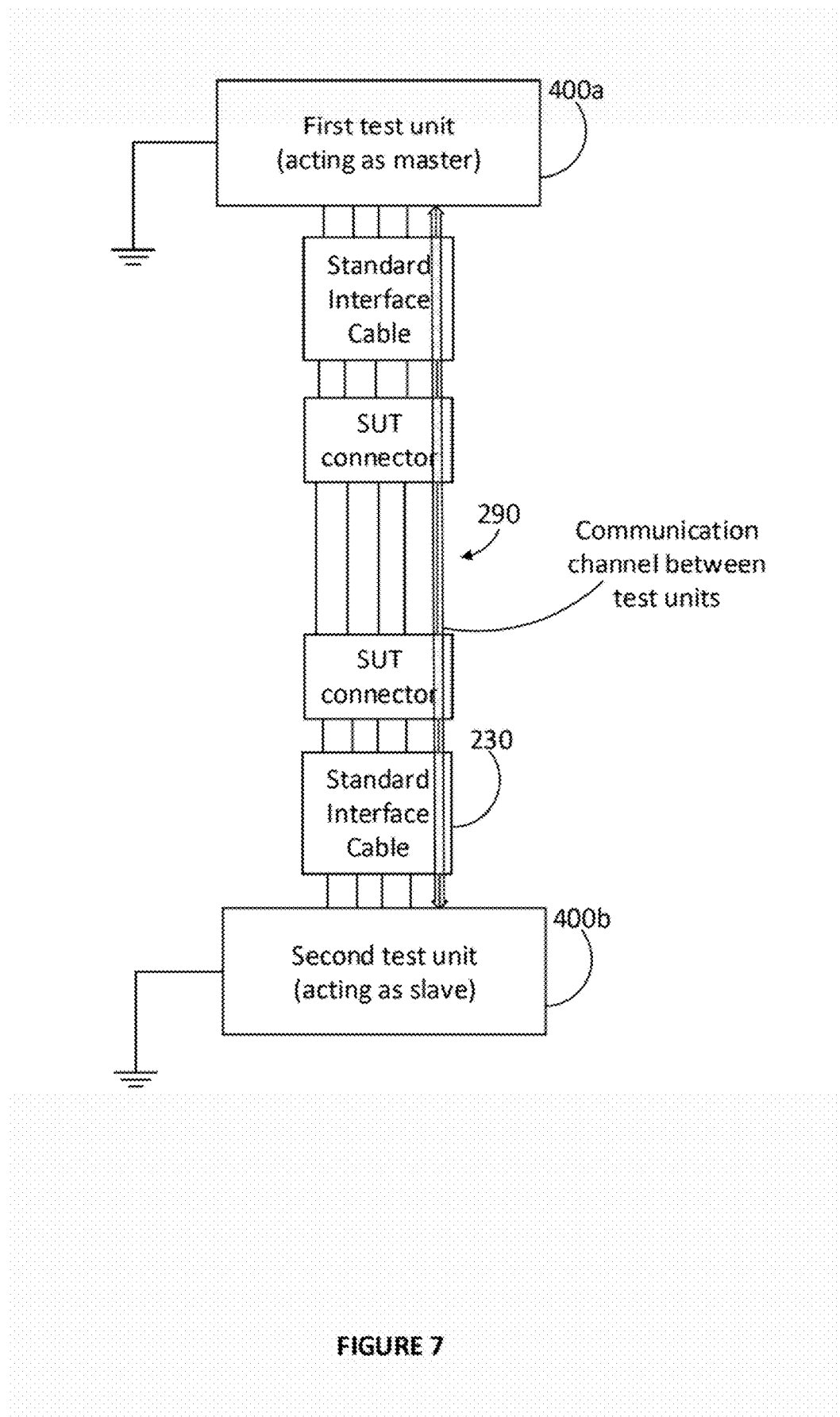
FIG. 7 is a block diagram illustrating a master test unit and a slave test unit connected to the wire harness under test and communicating through the wire harness under test, according to an embodiment.

Regardless of the embodiments described above (i.e., with a slave connector, or with a slave test unit), there is a need for test units to communicate between them. This is shown in FIGS. 6-7 for the two-unit embodiment, and in FIGS. 8-9 for an exemplary three-unit embodiment.

Using long cables to connect test units together is cumbersome, expensive and greatly affects the portability of the system used for testing or maintenance.

The test units described herein can advantageously be provided as wireless units, communicating through a wireless communication protocol.

However, despite the apparent benefit of using wirelessly communicating test units, there are cases in which this method of communication is in fact inconvenient.

Indeed, in a case in which the distributed test equipment (i.e., two or more test units communicating together) is used on large vehicles like ships, it may be difficult to use wireless communication to communicate with the distributed test units. It can also be inconvenient to install, even temporarily, a network cable to connect the distributed test units, since it is cumbersome and also requires having long cables available for such a task, as mentioned above.

According to an embodiment of the invention, communication between test units is performed through the wire (or wires) under test. The subject under test (SUT) is therefore used as the medium to communicate with the distributed test units. In the present invention, one test unit would be used as the master unit and another test unit would be used as a slave test unit. The master test unit will try to communicate with the slave test unit with any of the wire under test, while testing the wire at the same time. If the integrity of the wire is verified, the communication is supposedly performed successfully and the slave test unit would reply on the same wire.

By assuming that at least one wire of the SUT has sufficient quality for communicating therethrough, it suffices to identify this at least one wire using a testing procedure. Once this is done, the wire of the SUT identified as being suitable for communication can be used by the test units to communicate together, without a need for wireless communications, and without a need for a dedicated communication cable outside the SUT. Therefore, the SUT is advantageously used as the medium for communication between test units which are testing the SUT itself.

If the wire that is good to communicate is already known, it can be used for communication. If the wire that is good to communicate is not already known, it can be found, as described above. This is a blind test, and it implies that communication may take place in the electrical circuit itself even though the architecture of this electrical circuit is not known from the start, and even though the quality of wires in the harness is not known before communicating through at least one of these wires.

The master test unit can thus communicate with the microcontroller or FPGA of the slave test unit (or the identifier of the slave connector) to make a command. Once the slave test unit, or the test unit by the slave connector, executes the command, it can respond back on the wire of the SUT that was used to send the command to communicate a result. This can be repeated.

The central processor of the ATE generally controls the entire test, including reading the database, sending test commands to all test units, including slave connectors (if applicable), recording all tests results received from all test units, including slave connectors (if applicable), computing results and merging data lists. In another embodiment, this central processor and the program executed by the central processor may be incorporated into the master test units to have the master test unit perform these tasks instead.

Figure 5:
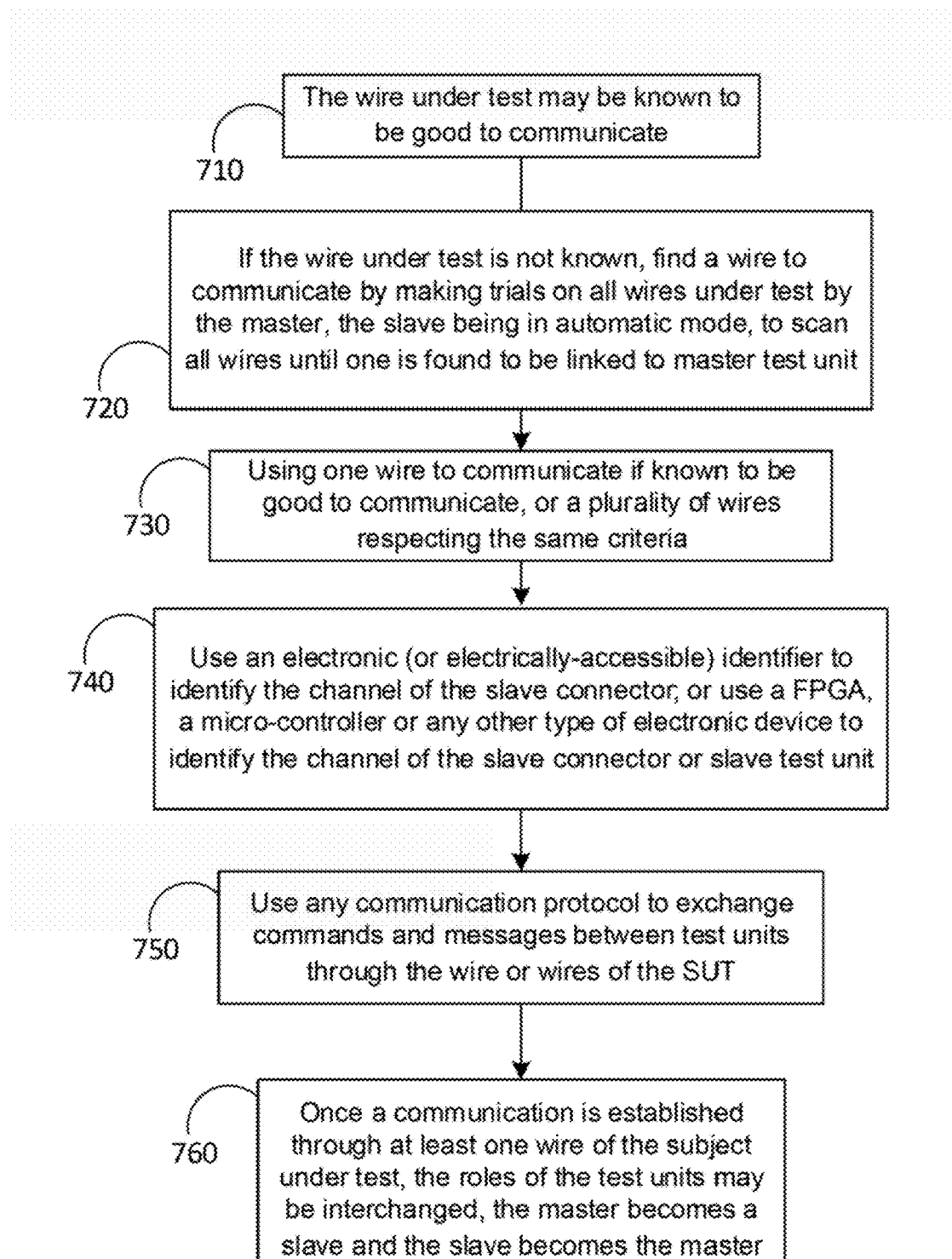
FIG. 5 is a flowchart illustrating the method for communicating through the SUT between a master test unit and a slave test unit or a slave connector, according to an embodiment.

The procedure for performing a test on a SUT (i.e., a wire harness) while communicating through a wire or wires of the same SUT between test units can be summarized as follows, and as shown in FIG. 5:

(Step 710) The wire under test may be known to be good to communicate;

(Step 720) If the wire under test (the one that should be known to be good to communicate) is not known, the master test unit will need to find a wire to communicate by making trials on all wires under test, and the slave test unit being in an automatic mode, to scan all wires until one is found to be linked to master test unit and respond on this specific wire;

(Step 730) Using one wire to communicate if known to be good to communicate, or a plurality of wires respecting the same criteria;

(Step 740) Use an electronic (or electrically-accessible) identifier to identify the channel of the slave connector; or use a FPGA, a micro-controller or any other type of electronic device to identify the channel of the slave test unit or slave connector (Step 750) Use any communication protocol to exchange commands and messages between master test units and slave tester or slave connector through the wire or wires of the SUT;

(Step 760) Once a communication is established through at least one wire of the subject under test, the roles of the test units may be interchanged, the master becomes a slave and the slave becomes the master.

In an embodiment, the method of communication of an automated test equipment to validate integrity of electrical harness using the subject under test as the medium to communicate where:

The automated test equipment comprises at least two test units (distributed electrical test units);

The first test unit or tester will act as the master test unit to send a test signal in one of the wire under test;

The second test unit or tester will act as a slave test unit to read the test signal sent by the first test unit in the wire under test;

The slave test unit will respond to the first test unit on the wire under test to establish a communication channel between the test units or test units without requiring wiring external to the SUT or without requiring a functional wireless communication channel between them.

Once a communication channel is open the test units will use it to communicate bi-directionally, i.e., send and receive commands, and reply and receive responses, involving sending and receiving communication signals which are modulated and/or encoded to carry information, such as commands or test results.

While the communication protocol for communication through the communication channel via the wire(s) of the wire harness under test does not need to be limited to a specific protocol, the signals sent by the test units to the other units for communicating through the wire(s) of the wire harness under test should be modulated and/or encoded such that information can be transmitted and received. The communication signals may be modulated and/or encoded and therefore differ from other signals for testing which are not (necessarily) modulated and/or encoded since test signals do not need to carry information.

While preferred embodiments have been described above and illustrated in the accompanying drawings, it will be evident to those skilled in the art that modifications may be made without departing from this disclosure. Such modifications are considered as possible variants comprised in the scope of the disclosure.

The invention claimed is:

1. A method for communicating between distributed test units used in testing a wire harness, the distributed test units comprising a first test unit and a second test unit, the method comprising:
   electrically connecting the first test unit and the second test unit to the wire harness under test;
   sending a communication signal through a circuit comprising a wire of the wire harness from any one of at least one node of the first test unit and at least one node of the second test unit; and
   establishing, by using the communication signal, a communication between the distributed test units.

2. The method of claim 1, further comprising at least one of:
   determining that the wire is suitable for communicating prior to sending the communication signal; and
   sending a test signal through the circuit from the first test unit to the second test unit, to identify that the wire is suitable for communicating.

3. The method of claim 2, wherein determining that the wire is suitable for communicating comprises:
   if an electronic identifier is present on the circuit, reading the electronic identifier by the first test unit;
   switching a switch on the circuit to connect the first test unit to a reference of the second test unit while bypassing the electronic identifier; and
   sending a signal by the first test unit and measuring an electrical characteristic of the circuit for evaluating a quality of the circuit.

4. The method of claim 3, further comprising, after reading the electronic identifier, querying a database about an identity of the electronic identifier.

5. The method of claim 4, further comprising listing connections between terminations based on the identity of an electronic identifier of each wire.

6. The method of claim 2, wherein determining that the wire is suitable for communicating comprises:
   if an electronic identifier is present on the circuit, reading the electronic identifier by the second test unit; and
   sending a signal to the first test unit to advise on which wire to communicate test commands and test results between the distributed test units.

7. The method of claim 6, further comprising, after reading the electronic identifier, querying a database about an identity of the electronic identifier.

8. The method of claim 7, further comprising listing connections between terminations based on the identity of an electronic identifier of each wire.

9. The method of claim 1, wherein sending a communication signal comprises sending any one of a test command and a test result recognizable by the distributed test units.

10. The method of claim 1, wherein electrically connecting the first test unit and the second test unit comprises electrically connecting a master test unit and a slave test unit respectively.

11. The method of claim 1, wherein electrically connecting the second test unit comprises electrically connecting a slave connector with an identifier for each individual node and the method further comprising communicating, by the slave connector, through the wire harness under test.

12. The method of claim 1, wherein sending the communication signal through the circuit comprises modulating or encoding the communication signal to transmit information.

* * * * *